(12) United States Patent
Van Stell et al.

(10) Patent No.: US 11,859,608 B2
(45) Date of Patent: Jan. 2, 2024

(54) FLUID RESISTANT DISPLAY APPARATUS

(71) Applicant: Masterflex, LLC, Radnor, PA (US)

(72) Inventors: James Van Stell, Schaumburg, IL (US); Bradley J Blum, Marengo, IL (US)

(73) Assignee: Masterflex, LLC, Radnor, PA (US)

( * ) Notice: Subject to any disclaimer, the term of this patent is extended or adjusted under 35 U.S.C. 154(b) by 392 days.

(21) Appl. No.: 17/080,440

(22) Filed: Oct. 26, 2020

(65) Prior Publication Data
US 2022/0128049 A1    Apr. 28, 2022

(51) Int. Cl.
| | |
|---|---|
| *F04B 53/16* | (2006.01) |
| *F04B 49/06* | (2006.01) |
| *G06F 1/18* | (2006.01) |
| *F04B 53/04* | (2006.01) |
| *H05K 5/00* | (2006.01) |

(52) U.S. Cl.
CPC ............ *F04B 53/16* (2013.01); *F04B 49/065* (2013.01); *F04B 53/04* (2013.01); *G06F 1/182* (2013.01); *H05K 5/0008* (2013.01); *H05K 5/0013* (2013.01); *H05K 5/0018* (2022.08)

(58) Field of Classification Search
CPC ........ F04B 53/16; F04B 49/065; F04B 53/04; G06F 1/182; H05K 5/00; H05K 5/0004; H05K 5/0008; H05K 5/0013; H05K 5/0017; H05K 5/0018
See application file for complete search history.

(56) References Cited

U.S. PATENT DOCUMENTS

| | | | | |
|---|---|---|---|---|
| 4,575,663 | A * | 3/1986 | Papson | H02P 1/16 318/446 |
| 10,186,209 | B1 * | 1/2019 | Shah | G09G 3/20 |
| 2005/0260079 | A1 * | 11/2005 | Allen | F04D 15/00 417/423.1 |
| 2006/0291214 | A1 * | 12/2006 | Tessnow | F21S 43/26 362/294 |
| 2012/0308401 | A1 * | 12/2012 | Knedler | F04D 25/06 417/1 |
| 2017/0014302 | A1 * | 1/2017 | Liu | A61H 33/0087 |
| 2018/0081258 | A1 | 3/2018 | Clyne | |
| 2020/0191606 | A1 * | 6/2020 | Banhegyesi | G01R 21/133 |
| 2020/0205874 | A1 | 7/2020 | Wang et al. | |

(Continued)

OTHER PUBLICATIONS

Extended European Search Report dated Apr. 8, 2022 in corresponding European Appl. No. 21204794.8.

*Primary Examiner* — Kenneth J Hansen
*Assistant Examiner* — David N Brandt
(74) *Attorney, Agent, or Firm* — Faegre Drinker Biddle & Reath LLP

(57) ABSTRACT

Aspects are provided for a case for a pump assembly having a base and an enclosure assembly. The enclosure assembly includes a case cover coupled to the enclosure assembly via a gasket, wherein the case cover and the enclosure assembly form a gap between the case cover and the enclosure assembly in a portion of the case cover without the gasket, a display, a plurality of bosses, a frame plate removable fastened to the plurality of bosses, wherein the display is fixedly attached to the case cover when the frame plate is fastened to the plurality of bosses, and one or more drainage channels disposed at an underside surface of the case cover, the one or more drainage channels being configured to divert fluid away from the display.

16 Claims, 12 Drawing Sheets

(56) References Cited

U.S. PATENT DOCUMENTS

2020/0322720 A1    10/2020  Penrod et al.
2021/0017888 A1*    1/2021  Lentini .................. F04B 15/02
2022/0339063 A1*   10/2022  Huang .................... A61H 1/00

* cited by examiner

FLUID RESISTANT DISPLAY APPARATUS

FIELD

Aspects of the present disclosure relate to a fluid resistant display and other features associated with a pump drive.

BACKGROUND

Fluid handling apparatuses such as pumps are used in various environments to supply fluids. For example, pumps may operate unattended for continuous laboratory or manufacturing processes. However, the handling of fluid by a pump may expose various components of the pump and/or the pump drive to the fluid. The exposure may cause these components, such as a display on the pump drive, to malfunction.

There remains an unmet need in the related art for a pump drive to include components that are resistant to fluid exposure, among other needs.

SUMMARY

The following presents a simplified summary of one or more aspects of the present disclosure in order to provide a basic understanding of such aspects. This summary is not an extensive overview of all contemplated aspects, and is intended to neither identify key or critical elements of all aspects, nor delineate the scope of any or all aspects. Its purpose is to present some concepts of one or more aspects in a simplified form as a prelude to the more detailed description that is presented later.

In an aspect, the present disclosure includes an enclosure assembly of a pump that may have one or more of a case body having an opening therein; one or more of a case cover coupled to the enclosure assembly, wherein the case cover and the enclosure assembly form a gap between the case cover and the enclosure assembly in a portion of the case cover; a display integrated with the case cover; a plurality of bosses locatable between the case body and the case cover; a frame plate removable fastened to the plurality of bosses, wherein the display is fixedly attached to the case cover when the frame plate is fastened to the plurality of bosses; and/or one or more drainage channels disposed at an underside surface of the case cover, the one or more drainage channels being configured to divert fluid away from the display via the gap, for example.

In some aspects, the present disclosure includes a case for a pump assembly that may have a base and an enclosure assembly. The enclosure assembly may include one or more of a case body having an opening therein; one or more of a case cover coupled to the enclosure assembly, wherein the case cover and the enclosure assembly may form a gap between the case cover and the enclosure assembly in a portion of the case cover; a display integrated with the case cover; a plurality of bosses locatable between the case body and the case cover; a frame plate removable fastened to the plurality of bosses, wherein the display is fixedly attached to the case cover when the frame plate is fastened to the plurality of bosses; and/or one or more drainage channels disposed at an underside surface of the case cover, the one or more drainage channels being configured to channel a flow of fluid received within the enclosure assembly.

These and other aspects of the present disclosure will become more fully understood upon a review of the detailed description, which follows.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

In an aspect, the disclosure may provide for an enclosure assembly having a case cover that is usable with a pump, such as a positive displacement pump. The case cover may include one or more drainage channels that divert fluid away from the display of the case cover. The drainage channels may be disposed on an underside surface of the case cover, for example. In one example implementation, as fluid accumulates on or near the display, the fluid may enter the one or more drainage channels to be diverted away from the display.

Figure 1:
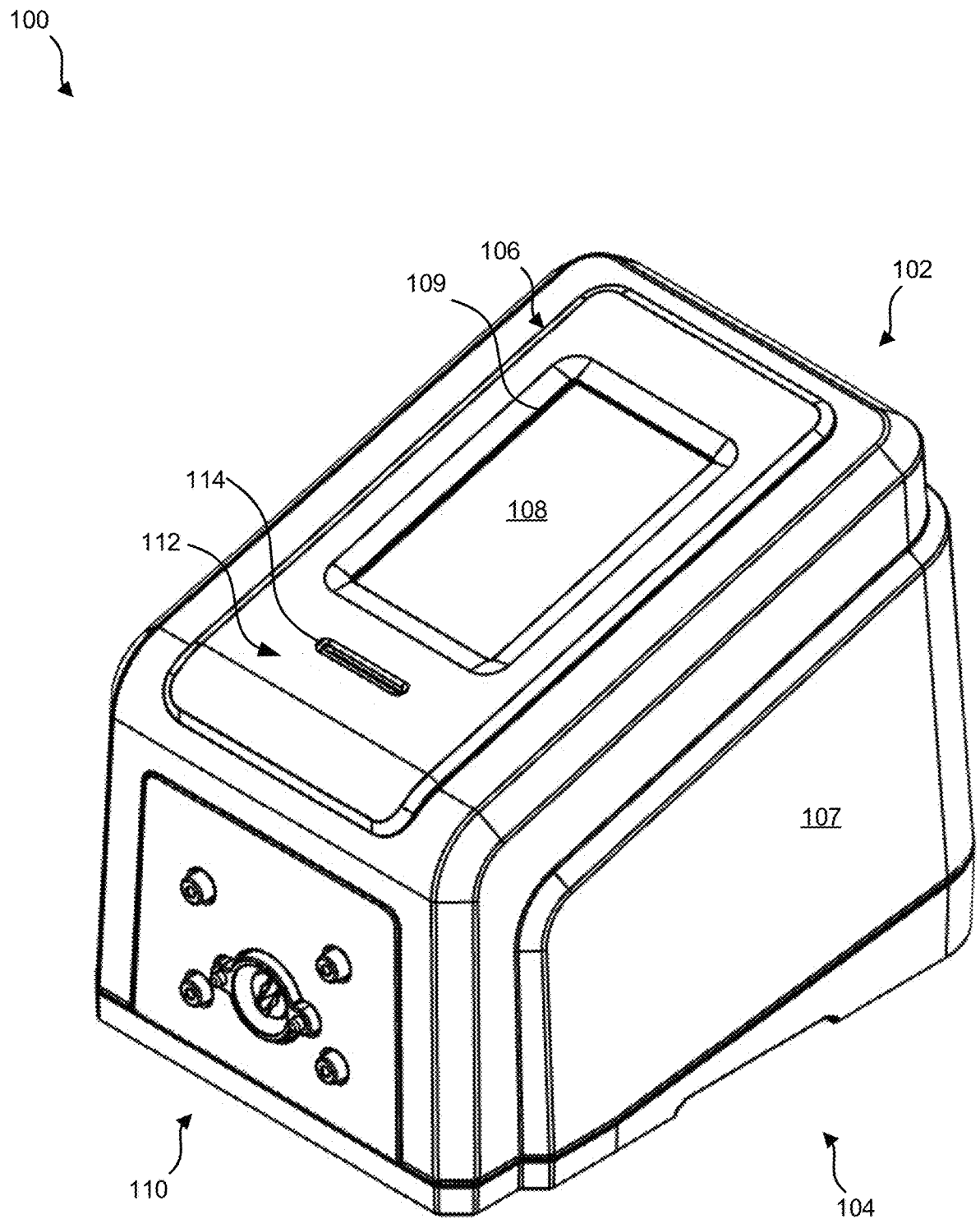
FIG. 1 illustrates a perspective view of an example of a case, according to an aspect of the present disclosure.

FIG. 1 illustrates a perspective view of an example of the case 100 (which may also encompass a pump drive, for example). In some implementations, the case 100 may include an enclosure assembly 102 and a base 104. The enclosure assembly 102 and the base 104 may enclose mechanical, electrical, hydraulic, and/or other components. The case 100 may include a case cover 106 and a case body 107. The case body 107 may include an opening that is covered by the case cover 106. The case cover 106 may include a display 108 for displaying information related to the operation and/or status of the case 100. The display 108 may be a touch sensitive display, such as a capacitive touch sensitive display, a resistive touch sensitive display, etc. The display 108 may be optionally framed by a bezel 109 of the case cover 106. The case cover 106 and/or the display 108 may be configured to prevent fluid from interfering with the operation of the display 108 as described in more detail below. The case 100 may include a pump cover 110 configured to couple to a pump head (not shown in FIG. 1).

In an example implementation, the case cover 106 may include a diffuser 114 and one or more light emitting diode (LED) and/or other indicators 112. The one or more indicators 112 may be disposed underneath the diffuser 114. The diffuser 114 may diffuse, scatter, and/or distribute the light from the one or more indicators 112. The one or more indicators 112 may be controlled by a LED array (not shown, discussed below). The one or more indicators 112 may be optionally covered by a light diffuser configured to diffuse the light from the one or more indicators 112. The one or more indicators 112 may include organic LED, III-V LED, quantum dot LED, etc. The LED array may adjust (individually or together) the luminance intensities of the one or more indicators 112, the illumination pattern (e.g., pulsing, blinking, flashing, continuous illumination, etc.) of the one or more indicators 112, and/or the colors of the one or more indicators 112. The one or more indicators 112 may be configured indicate the operation and/or status of the case 100 and/or one or more components of the case 100. In one example, the one or more indicators 112 may be in an "off" (non-illuminating) state when the case 100 is in the off state, and on when the case 100 is in the on state. In another example, the one or more indicators 112 may flash to indicate to an operator that maintenance and/or inspection of the case 100 is necessary. In a third example, the one or more indicators 112 may illuminate light at a first color (e.g., blue) to indicate proper operation of the case 100 and a second color (e.g., red) to indicate improper operation of the case 100. Other illuminations may be implemented.

In certain implementations, the case cover 106 may be configured to include various features to divert fluid on or near (within 1 centimeter (cm), 2 cm, 3 cm, etc.) the case cover 106 and/or the display 108 away from the display 108. The case cover 106 may include one or more drainage channels at an underside surface of the case cover 106 (discussed below). The one or more drainage channels may be configured to divert the fluid on or near the case cover 106 and/or the display 108 away from the display 108.

Figure 2:
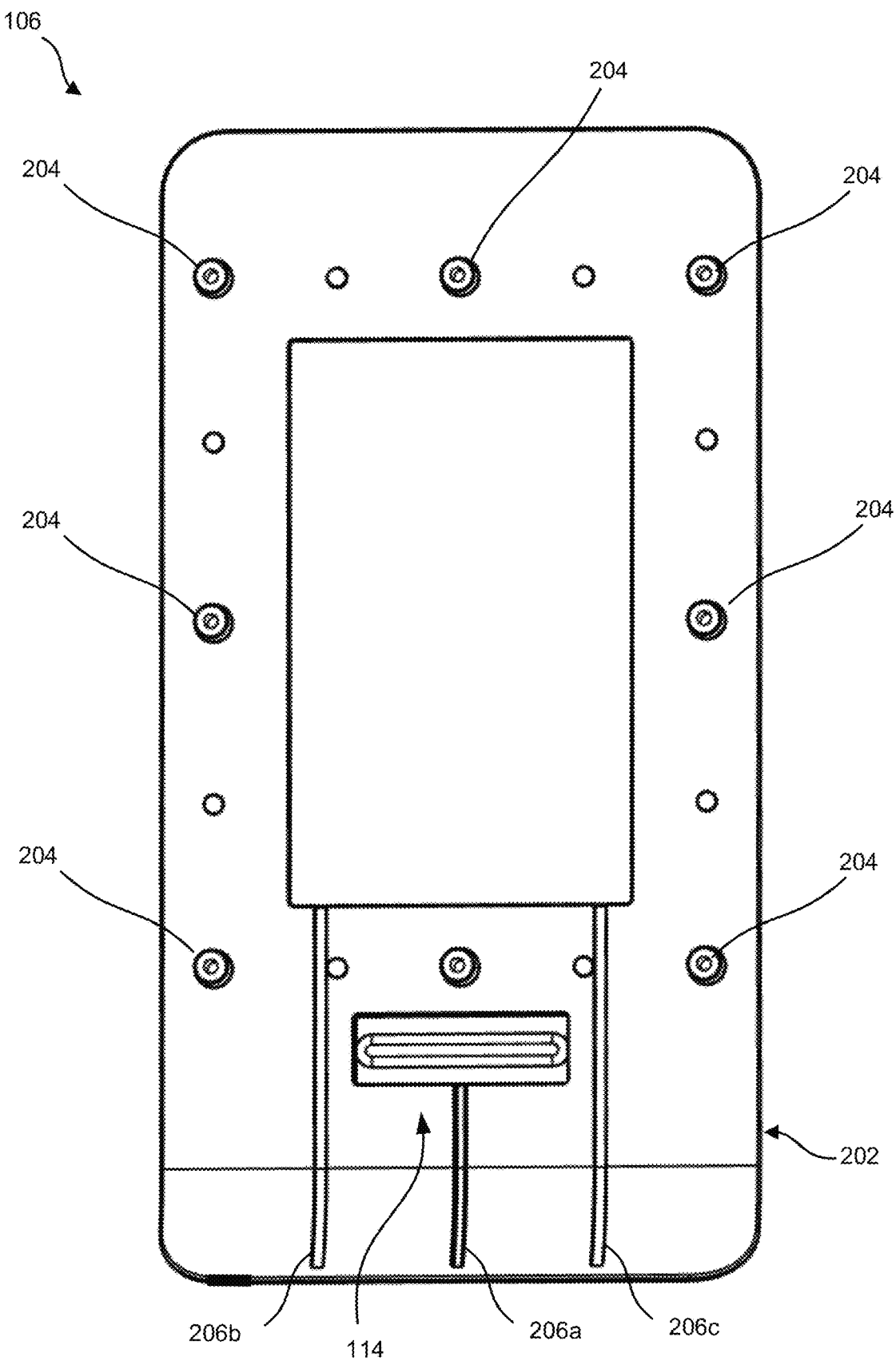
FIG. 2 illustrates a bottom view of an example of a case cover without a display, according to an aspect of the present disclosure.

FIG. 2 illustrates a bottom view of an example of the case cover 106 without the display 108 illustrated (FIG. 1). In certain implementations, the case cover 106 may include an underside surface 202. One or more bosses 204 may be disposed on the underside surface 202. The one or more bosses 204 may prevent the display 108 from being over-compressed (i.e., causing the display 108 to function improperly, such as delamination or discoloration) as discussed further below. The case cover 106 may include one or more drainage channels 206a-206c configured to divert fluid on or near the case cover 106 and/or the display 108, the diffuser 114, and/or on the underside surface 202 of the case cover 106, away from the display 108. For example, the first drainage channel 206a may diver fluid collecting near the diffuser 114 away from the diffuser 114 and/or the one or more indicators 112 (not shown). The second drainage channel 206b and the third drainage channel 206c may diver fluid collecting on or near the display 108 away from the display 108.

Figure 3:
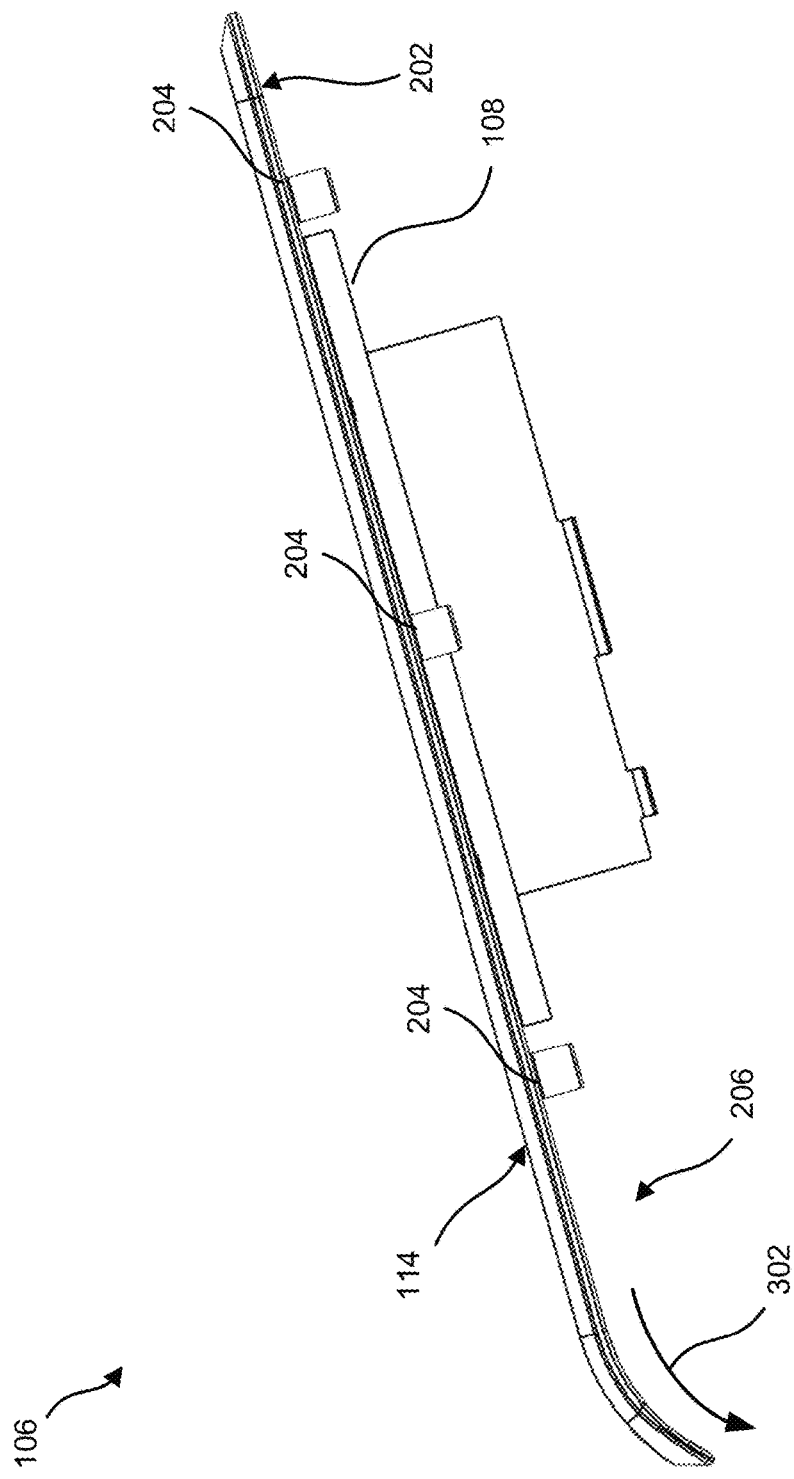
FIG. 3 illustrates a side view of an example of a case cover with a display, according to an aspect of the present disclosure.

FIG. 3 illustrates a side view of the case cover 106 with the display 108. In some implementations and referencing FIG. 2, the display 108 may abut the underside surface 202 of the case cover 106. In optional implementations, one or more gaskets may be emplaced for substantially sealing any gap between the underside surface 202 of the case cover 106 and the display 108. Fluid accumulating, for example, on the surface of the display 108, near the display 108, near the diffuser 114, and/or the on the case cover 106 may be diverted away via the drainage channels 206a-206c. For example, fluid pooling near the display 108 may enter one or more of the drainage channels 206a-206c. The fluid may travel in a direction 302 via one or more of the drainage channels 206a-206c, so as to be drawn away from the display 108 (due to gravitational force, capillary effect, etc.).

Figure 4:
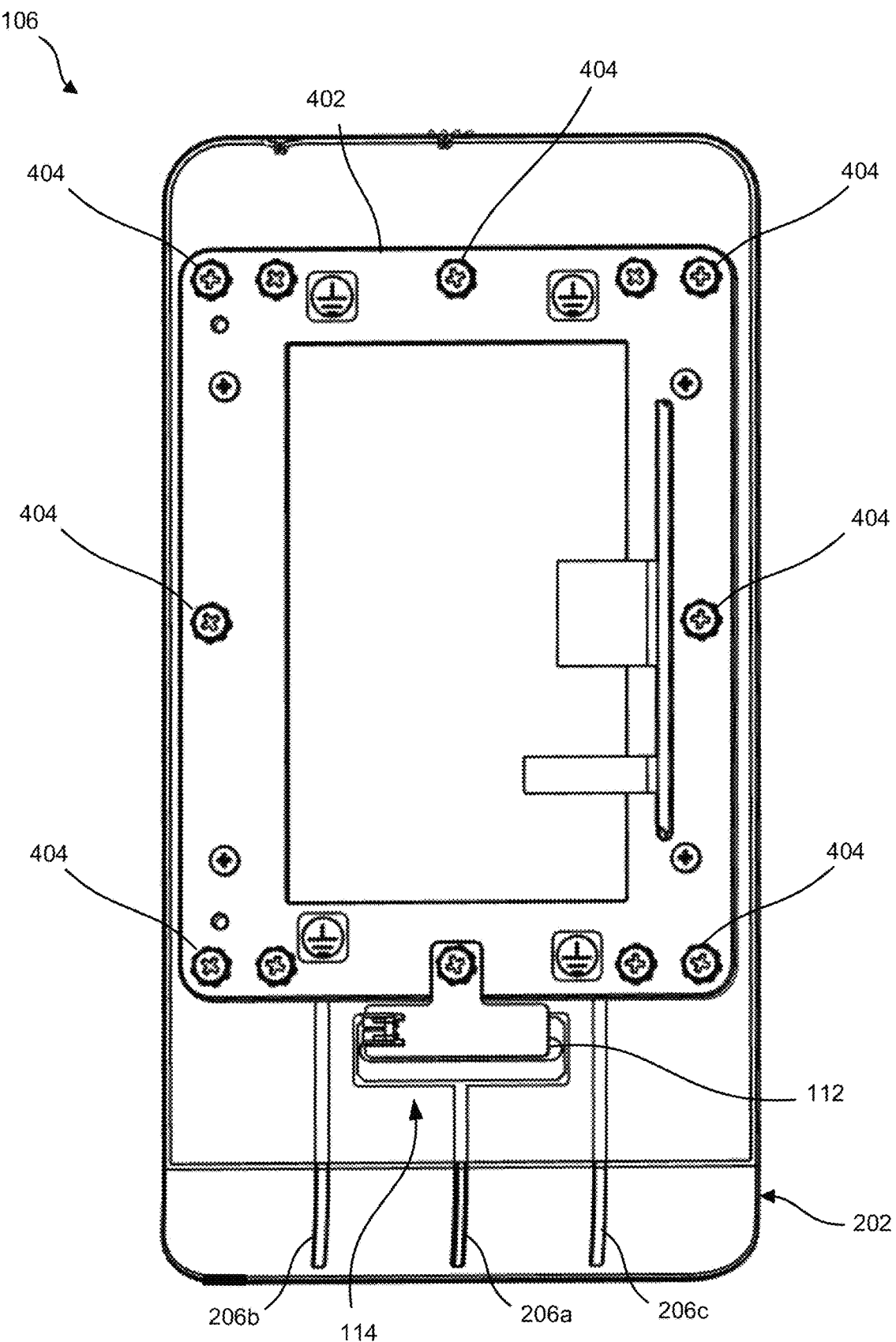
FIG. 4 illustrates a bottom view of an example of a case cover with a display and a frame plate, according to an aspect of the present disclosure.

FIG. 4 illustrates an underside or bottom view of the case cover 106 with the display 108 and a frame plate 402 shown. In one example implementation, the frame plate 402 may encapsulate at least a portion of the display 108. At least a portion of the display 108 may thereby be disposed between the case cover 106 and the frame plate 402. One or more fasteners 404 may fasten the frame plate 402 to the case cover 106. The one or more fasteners 404 may be or include screws, nails, bolts, battens, buckles, clamps, clips, pegs, pins, etc. In one example, the one or more fasteners 404 may be mateably inserted (e.g., screwed) into the one or more bosses 204 (FIG. 2). The one or more bosses 204 may prevent the frame plate 402 from over-compressing the display 108, thus avoiding the display 108 being distorted, delaminated, and/or discolored. The frame plate 402, when encapsulating the display 108, may reduce and/or prevent fluid, moisture, debris, and/or other contaminants from contacting or remaining contact with the display 108.

In an implementation, the frame plate 402 may include electrical connections for the display 108. The electrical connections may transfer data from an external device to the display 108 or data from the display 108 to the external device.

In certain example implementations, fluid accumulating on or near the display 108, on or near the one or more indicators 112, on or near the diffuser 114, and/or on or near the frame plate 402 may enter the one or more drainage channels 206a-206c. The one or more drainage channels 206 may thereby divert the fluid away from the display 108, the one or more indicators 112, the diffuser 114, and/or the frame plate 402.

Figure 5:
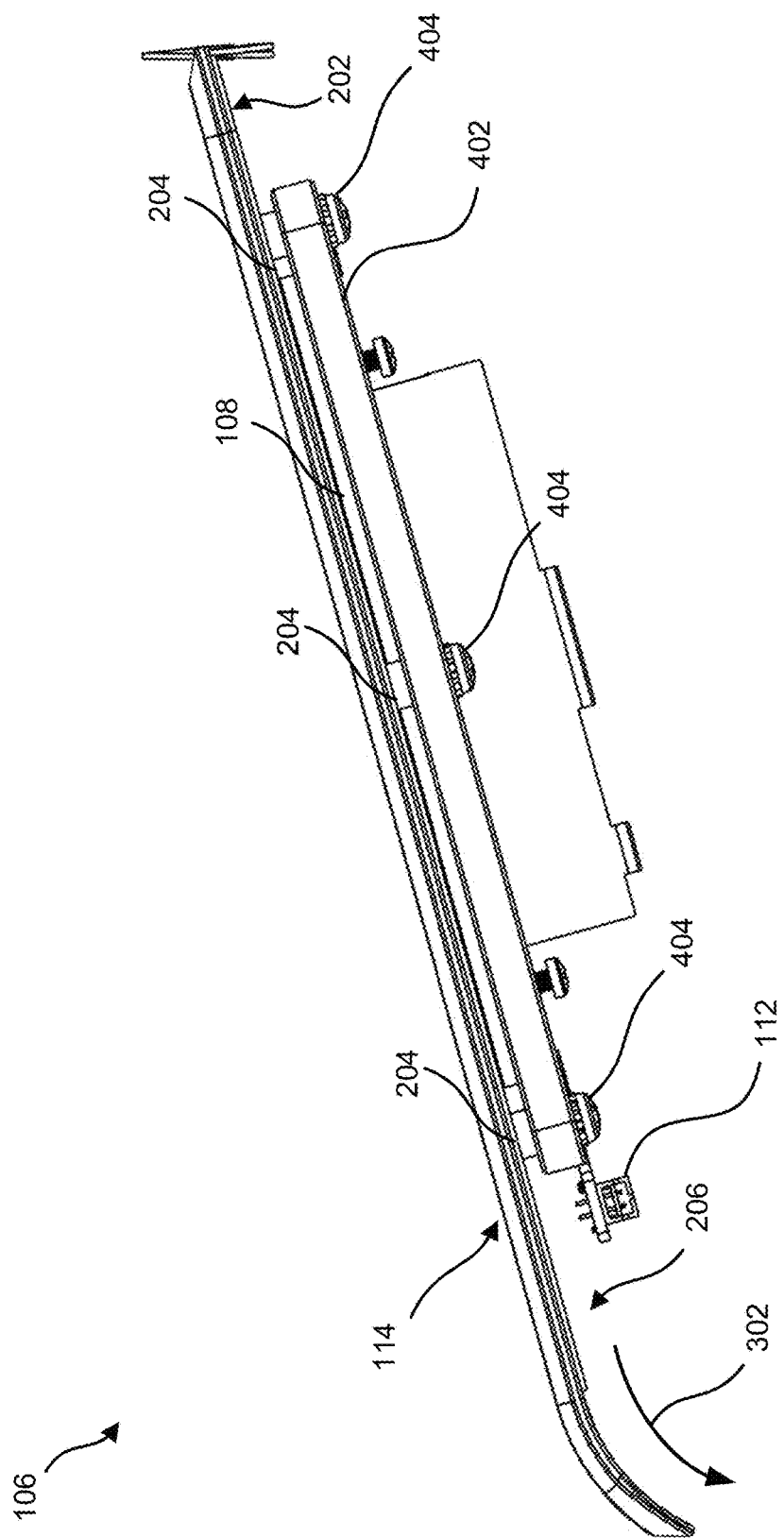
FIG. 5 illustrates a side view of an example of a case cover with a display and a frame plate, according to an aspect of the present disclosure.

FIG. 5 illustrates a side view of the case cover 106 with the display 108 and the frame plate 402 shown emplaced relative thereto. In some implementations and referencing FIG. 8, the display 108 may abut the underside surface 202 of the case cover 106. In optional implementations, one or more gaskets for substantially sealing any gap between the underside surface 202 of the case cover 106 and the display 108. Fluid accumulating on and/or near the display 108, near the diffuser 114, on and/or near the frame plate 402, and/or the on the case cover 106 may be diverted away via the drainage channels 206a-206c. For example, fluid pooling near the display 108 may enter one or more of the drainage channels 206a-206c. The fluid may travel in a direction 302 away from the display 108 (due to gravitational force, capillary effect, etc.).

Figure 6:
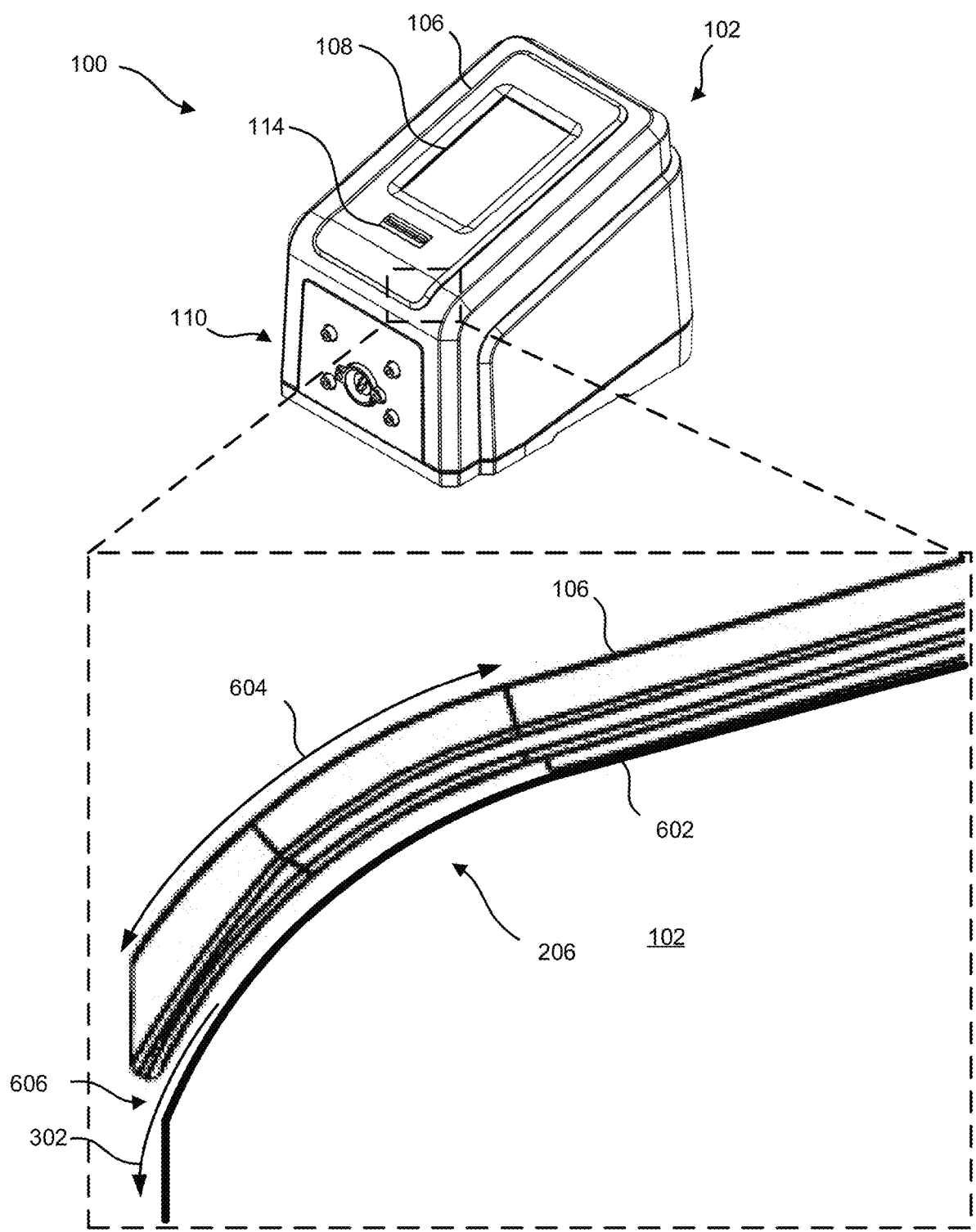
FIG. 6 illustrates a side view of an example of an enclosure assembly and a case cover of a case, according to an aspect of the present disclosure.

FIG. 6 illustrates a perspective view of the enclosure assembly 102 and the case cover 106 of the case 100, along with a close-up cross-sectional view of a portion of the assembly 102. In some implementations and referencing FIG. 8, the case cover 106 or the enclosure assembly 102 may include a gasket 602. The gasket 602 may prevent fluid from entering the case 100 where the gasket 602 is present. In one example implantation, a subjection delineated by arrows 604 of the case cover 106 may not contact the enclosure assembly 102 directly or via any gasket. As such, a gap 606 may exist between the case cover 106 and the case body 107 the enclosure assembly 102. During operation, for example, fluid accumulating on and/or near the display 108, on and/or near the diffuser 114, on and/or near the frame plate 402, and/or the on the case cover 106 may be diverted away via the drainage channels 206a-206c. The accumulated fluid may enter one or more of the drainage channels 206a-206c. The fluid may travel in a direction 302 away from the display 108, the diffuser 114, the frame plate 402, and/or the case cover 106 (due to gravitational force, capillary effect, etc.). The fluid may exit the drainage channels 206a-206c and trickle onto the pump cover 110 of the case 100.

In optional implementations, the pump cover 110 may include tubes, other drainage channels, pipes, or other devices configured to divert the fluid exiting the drainage channels 206a-206c away from the case 100.

Figure 7:
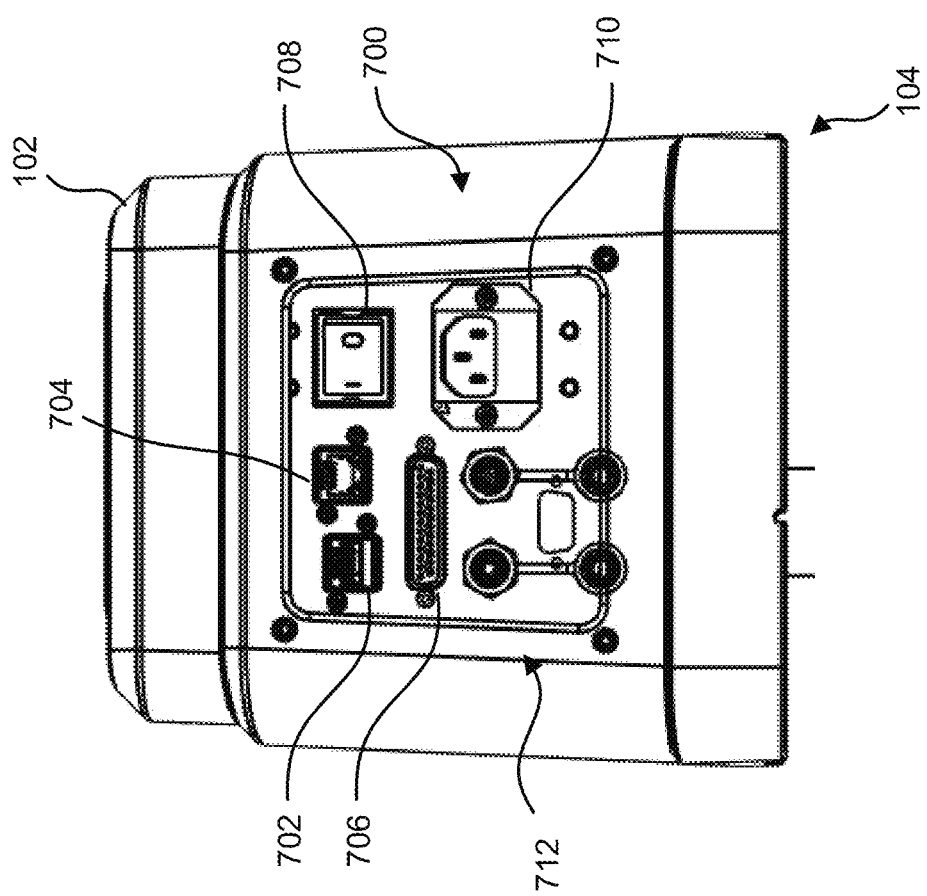
FIG. 7 illustrates a rear view of an example of a case, according to an aspect of the present disclosure.

FIG. 7 illustrates a rear view of the case 100 of FIG. 1. In certain implementations, the case 100 may include an interface panel 700. The interface panel 700 may be mounted onto the base 104. The interface panel 700 may include one or more electrical ports, connectors, and/or switches. In one illustrative implementation, the interface panel 700 may include a Universal Serial Bus (USB) port 702, an Ethernet port 704, and a Profibus port 706 (e.g., a DB9 Profibus port). The interface panel 700 may include a power switch 708 to turn the case 100 "on" or "off." The interface panel 700 may include an electrical power receptacle 710. The interface panel 700 may include one or more sensor connectors 712 configured to electrical connect to one or more sensors (e.g., temperature sensors, etc.). In other implementations, the interface panel 700 may include one or more serial ports, parallel ports, phone jack ports, Interbus ports, Controller Area Network (CAN) ports, Firewire ports, and/or other ports.

Figure 8:
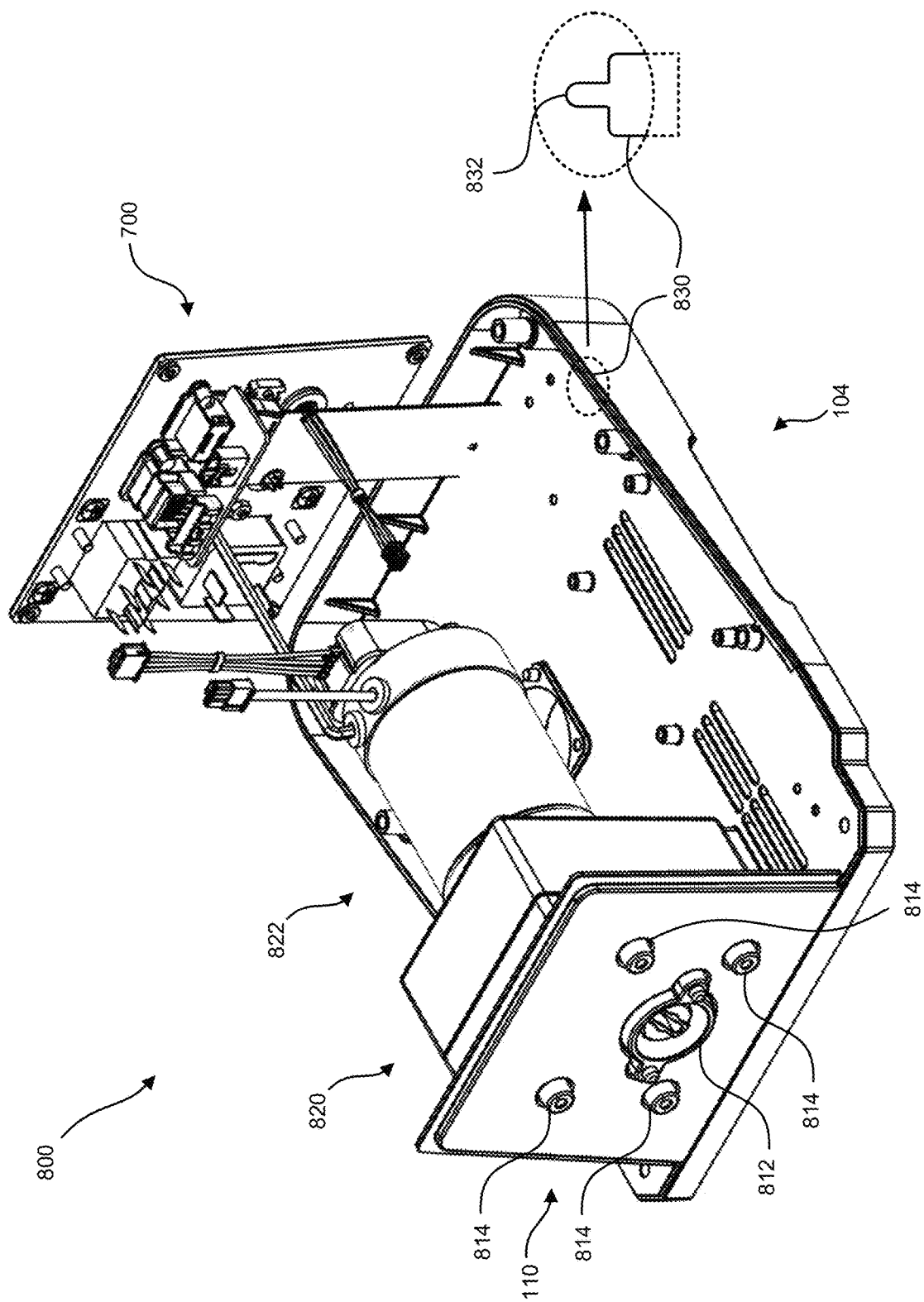
FIG. 8 illustrates a perspective view of an example of drive components disposed on the base, according to an aspect of the present disclosure.

FIG. 8 illustrates a perspective view of an example of drive components 800 disposed on the base 104. Some or all of the drive components 800 may be mounted to the base 104. In some implementations, the enclosure assembly 102 (FIGS. 1 and 4) may incorporate the pump cover 110, rather than the pump cover 110 being separate, as shown in FIG. 8. The pump cover 110 may include one or more bosses 814 configured to physically mate and/or couple to a pump head (not shown). The pump cover 110 may include a flange member 812 configured to connect to a fluid channel of the pump head (not shown in FIG. 8).

In some implementations, the drive components 800 may include a gear case assembly 820. The gear case assembly may be coupled to the pump cover 110. The drive components 800 may include a motor 822 configured to drive the pump head (not shown). The drive components 800 may optionally include a power supply (not shown) configured to convert the line voltage (e.g., 120 volt or 240 volt) to a direct current (DC) or alternative current (AC) voltage utilized by the drive components 800 for operation.

In an implementation, and also referencing various features shown in FIG. 1, an edge 830 of the base 104 may optionally include a lip 832 as shown in the cross-sectional view of the edge 830. The lip 832 may be configured to mateably coupled to an edge of the enclosure assembly 102 (FIG. 1). The lip 832 may prevent fluid from leaking into the inside of the case 100 (FIG. 1), for example. The lip 832 may be disposed toward the outside surface of the base 104, toward the inside surface of the base 104, or in between the outside surface and the inside surface of the base 104 (as shown).

Figure 9:
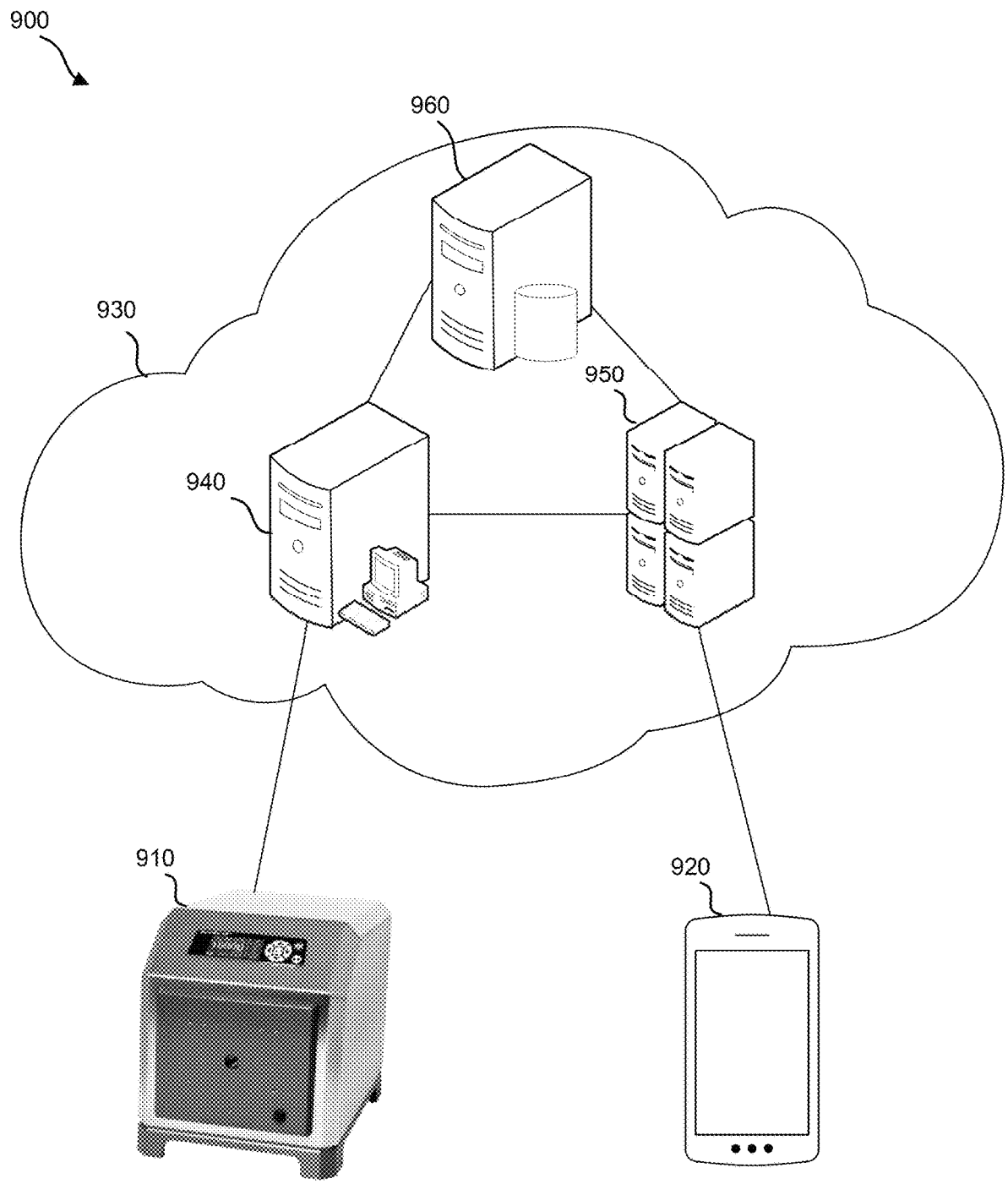
FIG. 9 is schematic diagram of an example network environment for a positive displacement pump, according to an aspect of the present disclosure.

FIG. 9 is a representative schematic diagram of an example network environment 900 in which a positive displacement pump 910 having a housing and other features, in accordance with aspects of the present disclosure, may be utilized. The network environment 900 may include a user device 920 (examples of which may also interchangeably be referred to herein as "terminals") for providing a user interface to a user, a communication network 930 for transmitting various communications among devices as described herein, a command server 940 for publishing commands to one or more positive displacement pumps 910, an application server 950 for providing an application to the user device 920, and a database server 960 for storing data reported by one or more positive displacement pumps 910 and user devices 920.

The positive displacement pump 910 may be a positive displacement pump including communications hardware (e.g., network interface) and software described herein for providing remote control of the positive displacement pump 910. In an aspect, the positive displacement pump 910 may operate in either a local mode, in which a local user interface is used to control operation of the positive displacement pump 910, or a remote mode, in which commands received via a network interface are used to control operation of the positive displacement pump 910.

The term "positive displacement pump" as used herein describes a category of fluid pumps that may contain or "trap" a fixed amount of fluid, such as within a portion of flexible tubing (e.g., a peristaltic pump), and force the contained or trapped fluid to a discharge pipe. Positive displacement pumps are conventionally used in processes that require precise measurement or dosing of fluid. Positive displacement pumps may be driven by an electric motor under the control of a controller (e.g., electronic control unit (ECU) and/or other processor) that moves fluid at a desired rate. In an aspect, a positive displacement pump may include a detachable pumphead that includes a casing and fluid contacting components of the positive displacement pump. The pumphead may be driven by the motor via a magnetic coupling, for example. The positive displacement pump may be fitted with variable pumpheads, depending on the desired operation. For example, in an aspect, a positive displacement pump may include a housing including the drive motor, controller, and user interfaces, and a detachable pumphead may be fitted in or on the housing. The selection of different pumpheads may configure the positive displacement pump 910 as, for example, one of a peristaltic pump, gear pump, or diaphragm pump. Examples of a positive displacement pump and/or a pumphead may be found in U.S. Pat. No. 10,578,096, the contents of which are hereby incorporated by reference in their entireties.

The user device 920 may include various computing devices that may be used to access an application via a web interface. For example, the user device 920 may be or include any mobile or fixed computer device, including but not limited to a desktop or laptop or tablet computer, a cellular telephone, a gaming device, a mixed reality or virtual reality device, a music device, a television, a navigation system, a camera, a personal digital assistant (PDA), a handheld device, or any other suitable computer device having wired and/or wireless connection capability with one or more other devices. The user device 920 may include a processor that executes an operating system and one or more applications. In an aspect, the user device 920 may execute a dedicated application for providing a user interface to the pump control application server 950. In another aspect, the user device 920 may execute a web browser application to access a webpage providing a user interface to the pump control application server 950. In an aspect, the user device 920 may be configured for secure communication with the application server 950. For example, the user device 920 may install a certificate of the application server 950 allowing device verification and encrypted communications.

The communication network 930 may be or include a computer network that allows communication among various devices. For example, the communication network 930 may include the Internet and may transmit data packets according to the Internet protocol. As illustrated, the communication network 930 may include the command server 940, application server 950, and database server 960. In an aspect, the command server 940, application server 950, and database server 960 may be implemented using a cloud architecture. For example, the command server 940, application server 950, and database server 960 may each be implemented as a virtual server to be provided by a cloud services provider. The cloud service provider may generate instances of the virtual servers using geographically dispersed computing hardware. A cloud architecture may provide scalability, load balancing, stability against network interruptions, and redundancy of stored data, among other features. It should be appreciated that the command server 940, application server 950, and database server 960 may also be implemented using conventional computer servers configured to execute the programs described herein.

The command server 940 may include one or more computer servers configured to publish commands to one or more positive displacement pumps 910, for example. In an aspect, the command server 940 may use a publish-subscribe based messaging protocol. For example, the command server 940 may use Message Queuing Telemetry Transport (MQTT) protocol. In an aspect, the use of a publish-subscribe based messaging protocol may provide security by having the positive displacement pumps 910 establish a connection to a known server, rather than accepting a connection from potentially different sources.

The command server 940 may publish commands to control the positive displacement pumps 910. The control may include commands for the positive displacement pump 910 to provide information. The commands may be associated with a command string or topic, which may include an identifier (i.d.) of the positive displacement pump 910 that should execute the command. The i.d. may be, for example, a media access control (MAC) address of the positive displacement pump 910. The commands may also include one or more parameters for executing the command. Table 9, below, includes a listing of example commands that may be used with a positive displacement pump 910.

TABLE 1

| TOPIC | DESCRIPTION |
| --- | --- |
| mflx/id/sts/online | Powerup and Last Will Topic, message = "true" or "false" |
| mflx/id/sts/Uptime | Time since power up and Date/Time. JSON |
| mflx/id/sts/Info | RPM, Model, Adapter and Connection. JSON |

TABLE 1-continued

| TOPIC | DESCRIPTION |
| --- | --- |
| mflx/id/sts/RunStatus | JSON<br>true = pump motor on,<br>false = pump motor off<br>true = dispense on,<br>false = dispense off<br>true = sensor open,<br>false = sensor closed<br>error code (0 = status OK) |
| mflx/id/sts/FlowDir | Flow direction, "CW" or "CCW" |
| mflx/id/sts/RemCont | "1" = Remote, "0" = Local |
| mflx/id/sts/DispMode | "Continuous", "Time" or "Volume" |
| mflx/id/sts/Tube | Size and calibration status in JSON "1", "2", . . . , "N" where N = last tube size selection false = tube not calibrated, true = calibrated |
| mflx/id/sts/FlowUnits | "1", "2", . . . , "N" where N = last flow units selection |
| mflx/id/sts/CumVol | Cumulative volume (Text string of float number) |
| mflx/id/sts/RemDisp | Remaining dispense volume and time in JSON |
| mflx/id/sts/BatchCount | Batch Count current and total in JSON |
| mflx/id/sts/FlowRate | Current, Min and Max flow rates in JSON |
| mflx/id/sts/NeedTimestamp | Request to server to send Unix Timestamp (no message) |

The command server 940 may implement a program for a positive displacement pump 910 by publishing commands. For example, the command server 940 may receive a selection of a program from the application server 950. The selected program may include a series of commands and parameters. The command server 940 may publish the commands at the appropriate time to control the positive displacement pump 910 to operate according to the program. Additionally, the command server 940 may receive feedback from the positive displacement pump 910 (e.g., in response to a Get command). The command server 940 may evaluate conditions based on the feedback for executing the program. In an aspect, the command server 940 may be implemented as a remote server that provides commands for multiple positive displacement pumps 910, which may be owned by different organizations, for example. In another aspect, a local command server may be implemented (e.g., by an organization) to allow control of local positive displacement pumps 910. For example, a command server 940 may be implemented on a user device 920 and communicate via a local area network (LAN) or other short-range communication protocol.

Application server 950 may include one or more computer servers configured to provide a user interface accessible via a user device 920. The application server 950 may communicate with dedicated applications executing on user devices 920 or may provide a web-based interface accessible via a web browser, for example. As described in further detail below, in one or more example implementations, the user interface provided by the application server may allow a user to configure one or more positive displacement pumps for operation. The application server 950 may also perform monitoring of the positive displacement pumps 910 and provide alerts to the user devices 920. The user interface may allow the user device 920 to configure which alerts to receive and how the alerts are received (e.g., via application notification, text, or email).

Database server 960 may store information collected from one or more positive displacement pumps 910 via the command server 940. The database server 960 may provide data security and integrity protection, for example. In an aspect, the database server 960 may collect and store data that may be reported to regulatory agencies, for example, as evidence of laboratory processes. The database server 960 may provide data security using secure socket layer (SSL) certificates to encrypt data between the pumps 910 and the database server 960. Additionally, access to the database server 960, as well as the application server 950 and command server 940, may be controlled using authenticated user names and passwords, for example. Actions on any of the servers may be attributed to a specific user. The database server 960 may generate an audit trail indicating which users performed actions at which time. Further, because the pumps 910 may be operated in either local mode or remote mode, the database server 960 may track actions taken in local mode even if a registered user is not identified. For example, the actions performed in local mode may therefore be attributed to a local user.

The database server 960 may segregate data of multiple customers. For example, a customer (e.g., a laboratory, corporation, or other entity), may have access only to data associated with devices belonging to the customer. A customer may designate multiple registered users (e.g., employees), who may access data based on user role. For example, the database server 960 may allow access to users based on a security level. For instance, an administrator may be able to configure database storage, export data, annotate data, and generate audit reports, while a regular user may only be able to read or export data. Additionally, a system administrator may not be associated with any customer and may at least read any data.

Figure 10:
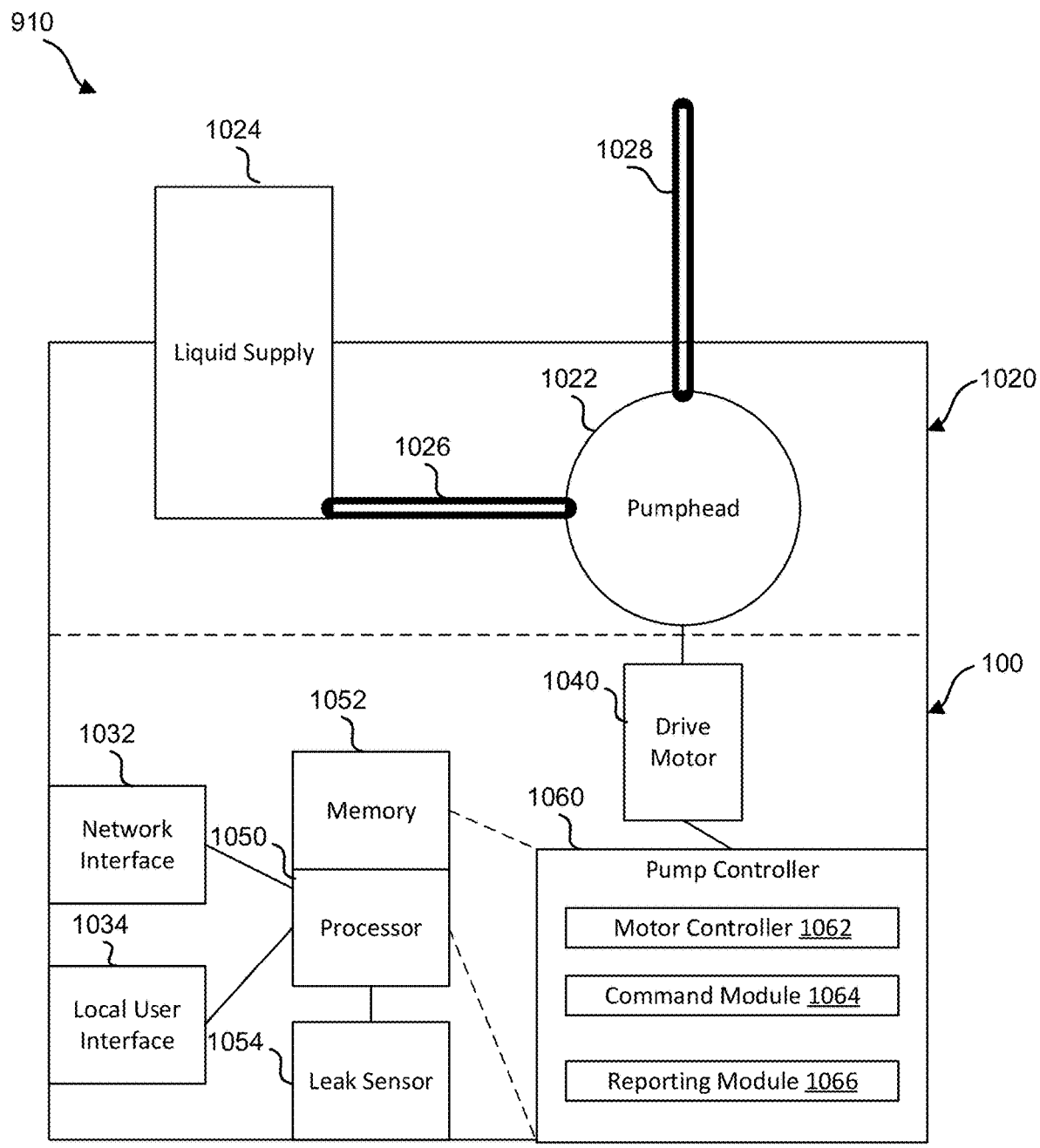
FIG. 10 is schematic diagram of an example positive displacement pump, according to an aspect of the present disclosure.

FIG. 10 is a representative schematic diagram of an example positive displacement pump 910 usable in accordance with aspects of the present disclosure. The positive displacement pump 910 may include a wet end 1020 and a case 100. The wet end 1020 may include fluid handling components including a pumphead 1022, a liquid supply 1024, an inlet tube 1026, and an outlet tube 1028. The wet end 1020 may be detachable from the case 100 to allow replacement or substitution of the wet end 1020. For example, different pumpheads 1022 may be selected for use in pumping different fluids.

The pumphead 1022 may include a mechanism for pumping fluid. In an aspect, the positive displacement pump 910 may use a pumphead that allows precise monitoring of the fluid being pumped (e.g., volume pumped). Example pumpheads may include a peristaltic pumphead, a quaternary diaphragm pumphead, and/or a gear pumphead. The pumphead 1022 may be connected to a liquid supply 1024 via an inlet tube 1026. The pumphead 1022 may pump the fluid to the outlet tube 1028. In an aspect, for example, using a peristaltic pump, the inlet tube 1026 and the outlet tube 1028 may be or include a continuous tube extending through the pumphead 1022.

The case 100 may include electronic components of the positive displacement pump 910.

For example, the case 100 may include a network interface 1032, a local user interface 1034, a drive motor 1040, a processor 1050, a memory 1052, and a leak sensor 1054. Further, the memory 1052 may store instructions executable by the processor 1050 for implementing a pump controller 1060, which may include a motor controller 1062, a command module 1064, and a reporting module 1066.

The network interface 1032 may include a wired or wireless network interface for transmitting and receiving data packets. In an aspect, the network interface 1032, for example, may utilize transmission control protocol/Internet protocol (TCP/IP) packets that may carry commands, parameters, or data. For example, the network interface 1032 may receive MQTT messages including the commands listed in Table 1 above. The network interface 1032 may forward commands to the processor 1050 for processing by the pump controller 1060. Conversely, the network interface 1032 may receive data generated by the pump controller 1060 from the processor 1050 and transmit the data to the command server 940.

The local user interface 1034 may include any suitable controls provided on the positive displacement pump 910 for controlling the positive displacement pump 910. In an aspect, the local user interface 1034 may include a display screen that presents menus for selecting commands similar to the commands transmitted by the command server 940. In another aspect, the local user interface 1034 may include dedicated buttons and/or other selection features that perform specific commands. For example, the local user interface 1034 may include a button for selection to start/stop pumping. The local user interface 1034 may generate commands to the processor 1050 for processing by the pump controller 1060. As noted above, the positive displacement pump 910 may operate in a remote mode in which the local user interface 1034 is at least partially disabled to prevent local input.

The drive motor 1040 may be or include an electric motor that provides a force for pumping the fluid. In an aspect, the drive motor 1040 may be magnetically coupled to the pumphead 1022 to drive the pumphead 1022. The drive motor 1040 may be controlled by the pump controller 1060. For example, the pump controller 1060 may generate a control signal indicating a speed and direction of the drive motor 1040 based on received commands.

The processor 1050 may include one or more processors for executing instructions. An example of processor 1050 may include, but is not limited to, any suitable processor specially programmed as described herein, including a controller, microcontroller, application specific integrated circuit (ASIC), field programmable gate array (FPGA), system on chip (SoC), or other programmable logic or state machine. The processor 1050 may include other processing components, such as an arithmetic logic unit (ALU), registers, and a control unit. The processor 1050 may include multiple cores and may be able to process different sets of instructions and/or data concurrently using the multiple cores to execute multiple threads, for example.

Memory 1052 may be configured for storing data and/or computer-executable instructions defining and/or associated with the pump controller 1060, and processor 1050 may execute such instructions with regard to operation of the pump controller 1060. Memory 1052 may represent one or more hardware memory devices accessible to processor 1050. An example of memory 1052 can include, but is not limited to, a type of memory usable by a computer, such as random access memory (RAM), read only memory (ROM), tapes, magnetic discs, optical discs, volatile memory, non-volatile memory, and any combination thereof. Memory 1052 may store local versions of a pump controller application being executed by processor 1050, for example.

Leak sensor 1054 may be or include a hardware leak sensor that detects whether liquid is leaking within or from the positive displacement pump 910. For example, a leak may occur when a component of the wet end 1020 fails or becomes detached. In such a situation, the inlet tube 1026 or the outlet tube 1028 may rupture or become detached from the pumphead 1022. In an aspect, the leak sensor 1054 may include an electronic mesh that forms a circuit when liquid is present. The leak sensor 1054 may be coupled to the processor 1050, which may generate a stop command to stop operation of the positive displacement pump 910 in response to the leak sensor 1054 detecting a leak. Stopping the positive displacement pump 910 may prevent damage to the pump and waste of a fluid, for example. Further, a notification of the leak may be used to abort or modify a process using the positive displacement pump 910.

The pump controller 1060 may control operation of the positive displacement pump 910 based on commands received from either the network interface 1032 or the local user interface 1034, for example. The pump controller 1060 may include a motor controller 1062 for controlling operation of the drive motor 1040, a command module 1064 for interpreting and executing received commands, and/or a reporting module 1066 for monitoring pump operation and reporting data regarding the positive displacement pump 910.

Figure 11:
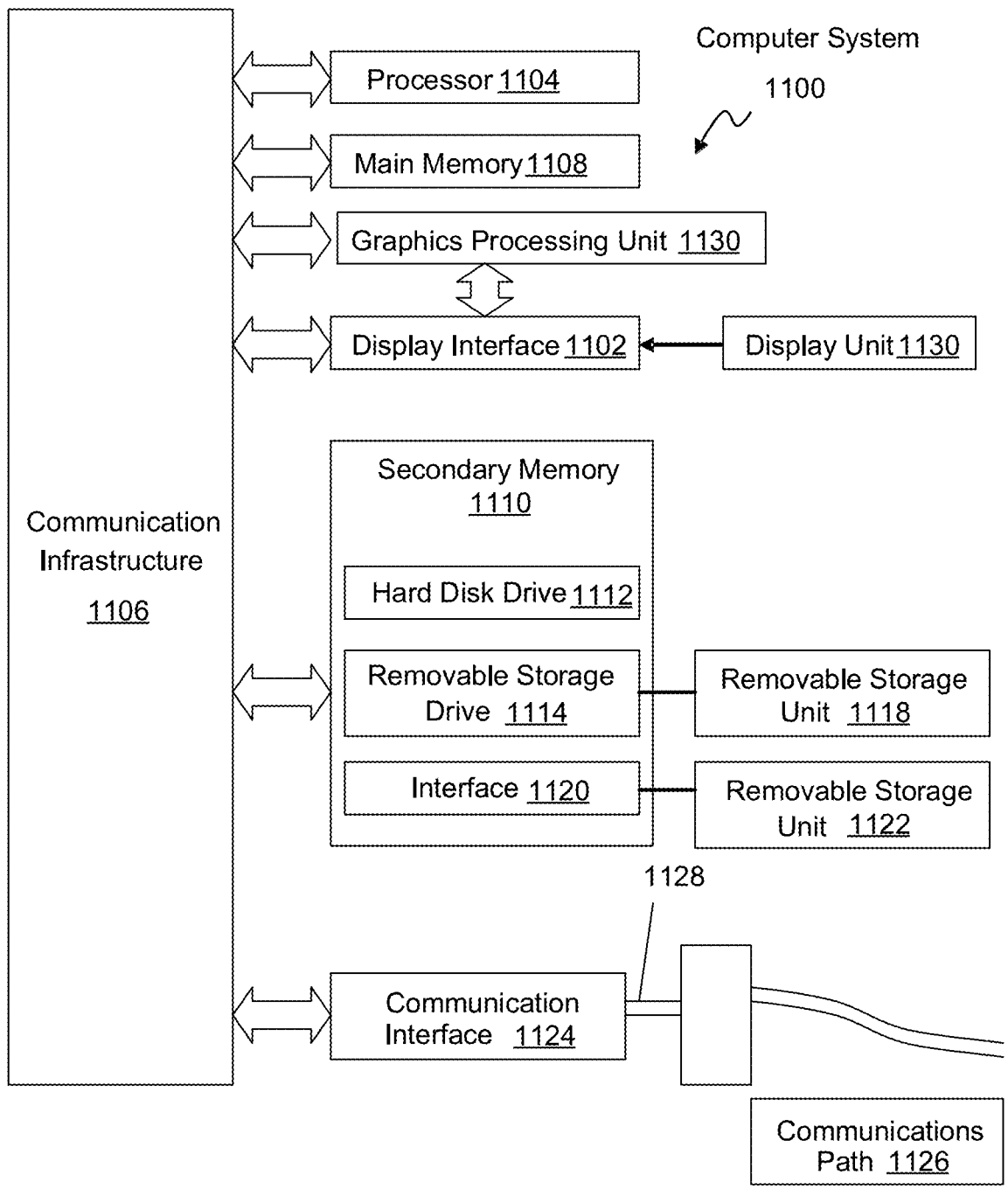
FIG. 11 presents an exemplary system diagram of various hardware components and other features, for use in accordance with aspects of the present disclosure.

Aspects of the present disclosure may be implemented using hardware, software, or a combination thereof and may be implemented in one or more computer systems or other processing systems. In one aspect, the disclosure is directed toward one or more computer systems capable of carrying out the functionality described herein. FIG. 11 presents an example system diagram of various hardware components and other features that may be used in accordance with aspects of the present disclosure. Aspects of the present disclosure may be implemented using hardware, software, or a combination thereof and may be implemented in one or more computer systems or other processing systems. In one example variation, aspects of the disclosure are directed toward one or more computer systems capable of carrying out the functionality described herein. An example of such a computer system 1100 is shown in FIG. 11.

Computer system 1100 includes one or more processors, such as processor 1104. The processor 1104 is connected to a communication infrastructure 1106 (e.g., a communications bus, cross-over bar, or network). Various software aspects are described in terms of this example computer system. After reading this description, it will become apparent to a person skilled in the relevant art(s) how to implement aspects of the disclosure using other computer systems and/or architectures.

Computer system 1100 may include a display interface 1102 that forwards graphics, text, and other data from the communication infrastructure 1106 (or from a frame buffer not shown) for display on a display unit 1130. Computer system 1100 also includes a main memory 1108, preferably random access memory (RAM), and may also include a secondary memory 1110. The secondary memory 1110 may include, for example, a hard disk drive 1112 and/or a removable storage drive 1114, representing a floppy disk drive, a magnetic tape drive, an optical disk drive, etc. The removable storage drive 1114 reads from and/or writes to a removable storage unit 1118 in a well-known manner. Removable storage unit 1118, represents a floppy disk, magnetic tape, optical disk, etc., which is read by and written to removable storage drive 1114. As will be appreciated, the removable storage unit 1118 includes a computer usable storage medium having stored therein computer software and/or data.

In alternative aspects, secondary memory 1110 may include other similar devices for allowing computer programs or other instructions to be loaded into computer system 1100. Such devices may include, for example, a removable storage unit 1122 and an interface 1120. Examples of such may include a program cartridge and cartridge interface (such as that found in video game devices), a removable memory chip (such as an erasable programmable read only memory (EPROM), or programmable read only memory (PROM)) and associated socket, and other removable storage units 1122 and interfaces 1120, which allow software and data to be transferred from the removable storage unit 1122 to computer system 1100.

Computer system 1100 may also include a communications interface 1124. Communications interface 1124 allows software and data to be transferred between computer system 1100 and external devices. Examples of communications interface 1124 may include a modem, a network interface (such as an Ethernet card), a communications port, a Personal Computer Memory Card International Association (PCMCIA) slot and card, etc. Software and data transferred via communications interface 1124 are in the form of signals 1128, which may be electronic, electromagnetic, optical or other signals capable of being received by communications interface 1124. These signals 1128 are provided to communications interface 1124 via a communications path (e.g., channel) 1126. This path 1126 carries signals 1128 and may be implemented using wire or cable, fiber optics, a telephone line, a cellular link, a radio frequency (RF) link and/or other communications channels. In this document, the terms "computer program medium" and "computer usable medium" are used to refer generally to media such as a removable storage drive 1114, a hard disk installed in hard disk drive 1112, and signals 1128. These computer program products provide software to the computer system 1100. Aspects of the disclosure are directed to such computer program products.

Computer programs (also referred to as computer control logic) are stored in main memory 1108 and/or secondary memory 1110. Computer programs may also be received via communications interface 1124. Such computer programs, when executed, enable the computer system 1100 to perform various features in accordance with aspects of the present disclosure, as discussed herein. In particular, the computer programs, when executed, enable the processor 1104 to perform such features. Accordingly, such computer programs represent controllers of the computer system 1100.

In variations where aspects of the disclosure are implemented using software, the software may be stored in a computer program product and loaded into computer system 1100 using removable storage drive 1114, hard disk drive 1112, or communications interface 1120. The control logic (software), when executed by the processor 1104, causes the processor 1104 to perform the functions in accordance with aspects of the disclosure as described herein. In another variation, aspects are implemented primarily in hardware using, for example, hardware components, such as application specific integrated circuits (ASICs). Implementation of the hardware state machine so as to perform the functions described herein will be apparent to persons skilled in the relevant art(s).

In yet another example variation, aspects of the disclosure are implemented using a combination of both hardware and software.

Figure 12:
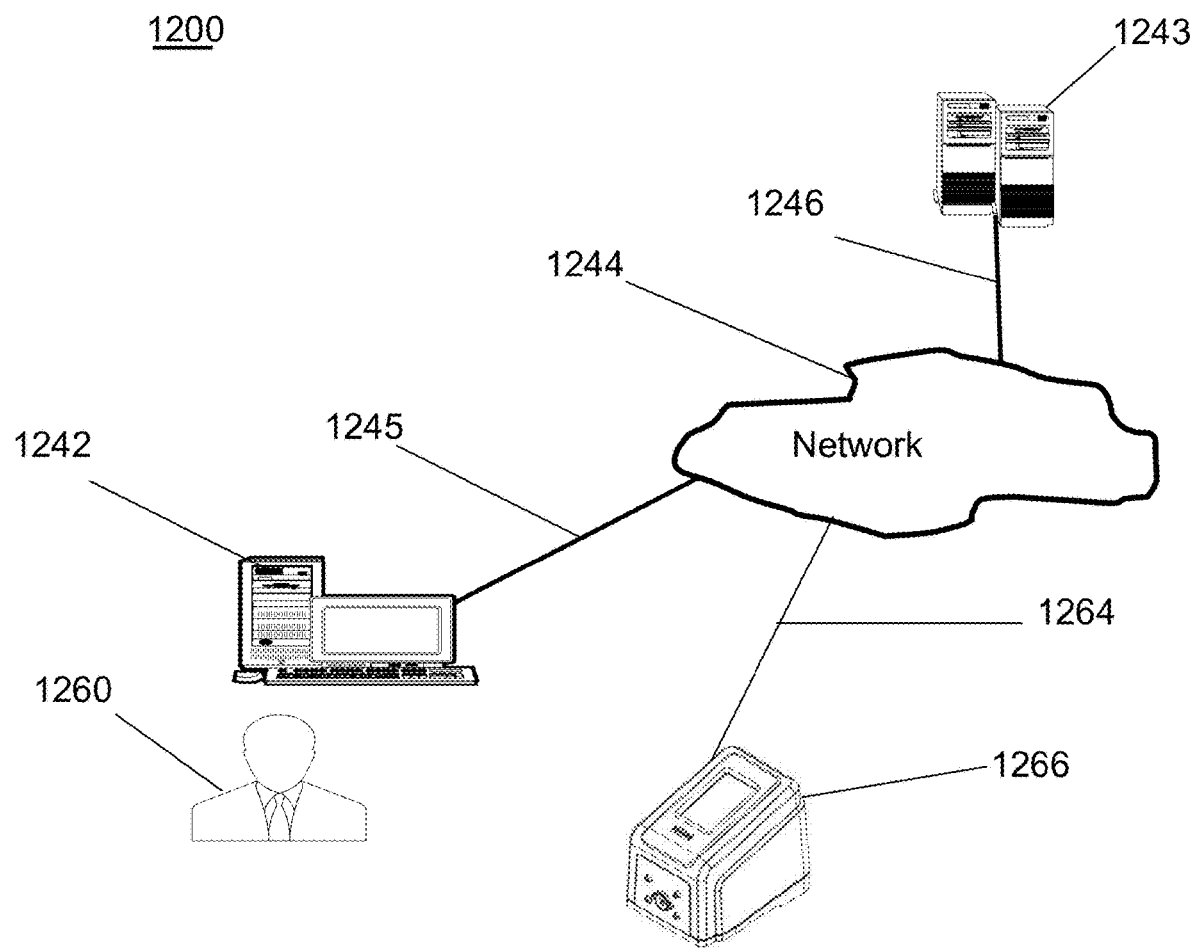
FIG. 12 is a block diagram of various exemplary system components, for use in accordance with aspects of the present disclosure.

FIG. 12 is a block diagram of various example system components (e.g., on a network) that may be used in accordance with aspects of the present disclosure. The system 1200 may include one or more accessor 1260 (also referred to interchangeably herein as one or more "users") and one or more terminals 1242, 1266 (which may be the case 100 in an example). The accessor 1260 may correspond to user devices 920 (FIG. 9). In one aspect, data for use in accordance with aspects of the present disclosure may, for example, be input and/or accessed by accessor 1260 via terminals 1242, 1266, such as personal computers (PCs), minicomputers, mainframe computers, microcomputers, telephonic devices, or wireless devices, such as personal digital assistants ("PDAs") or a hand-held wireless devices coupled to a server 1243, such as a PC, minicomputer, mainframe computer, microcomputer, or other device having a processor and a repository for data and/or connection to a repository for data, via, for example, a network 1244, such as the Internet or an intranet, and couplings 1245, 1246, 1264. The couplings 1245, 1246, 1264 include, for example, wired, wireless, or fiber optic links. In another example variation, the method and system in accordance with aspects of the present disclosure operate in a stand-alone environment, such as on a single terminal.

The aspects of the disclosure discussed herein may also be described and implemented in the context of computer-readable storage medium storing computer-executable instructions. Computer-readable storage media includes computer storage media and communication media. For example, flash memory drives, digital versatile discs (DVDs), compact discs (CDs), floppy disks, and tape cassettes. Computer-readable storage media may include volatile and nonvolatile, removable and non-removable media implemented in any method or technology for storage of information such as computer readable instructions, data structures, modules or other data.

In some aspects, an enclosure assembly of a pump may include a case cover coupled to the enclosure assembly via a gasket, wherein the case cover and the enclosure assembly form a gap between the case cover and the enclosure assembly in a portion of the case cover without the gasket, a display, a plurality of bosses, a frame plate removable fastened to the plurality of bosses, wherein the display is fixedly attached to the case cover when the frame plate is fastened to the plurality of bosses, and one or more drainage channels disposed at an underside surface of the case cover, the one or more drainage channels being configured to divert fluid away from the display via the gap.

Any of the enclosure assembly above, wherein the plurality of bosses prevent the display from being over-compressed by the frame plate.

Any of the enclosure assembly above, wherein first ends of the one or more drainage channels are closer to the display than second ends of the one or more drainage channels and the first ends are higher than the second ends.

Any of the enclosure assembly above, further comprising a base including a pump cover configured to fluidically couple to the pump.

Any of the enclosure assembly above, wherein the one or more drainage channels are further configured to divert the fluid toward the pump cover.

Any of the enclosure assembly above, further comprising one or more light emitting diode (LED) indicators and a diffuser configured to diffuse lights from the one or more indicators.

Any of the enclosure assembly above, wherein the display is a touch-sensitive display.

Some aspects of the present disclosure includes a case for a pump assembly including a base, an enclosure assembly having a case cover coupled to the enclosure assembly via a gasket, wherein the case cover and the enclosure assembly form a gap between the case cover and the enclosure assembly in a portion of the case cover without the gasket, a display, a plurality of bosses, a frame plate removable fastened to the plurality of bosses, wherein the display is fixedly attached to the case cover when the frame plate is fastened to the plurality of bosses, and one or more drainage channels disposed at an underside surface of the case cover, the one or more drainage channels being configured to divert fluid away from the display via the gap.

Any of the case above, further comprising a pump head, wherein the base comprises a pump cover configured to fluidically couple to the pump head.

Any of the case above, wherein the one or more drainage channels are further configured to divert the fluid toward the pump cover.

Any of the case above, wherein the base comprises a motor configured to drive the pump head.

Any of the case above, wherein the base comprises a lip configured to mateably couple to an edge of the enclosure assembly to prevent fluid from entering the case.

Any of the case above, wherein the base comprises an interface panel including one or more electrical ports.

Any of the case above, wherein the one or more electrical ports include at least a Universal Serial Bus port, an Ethernet port, a Profibus port, a serial port, a parallel port, a phone jack port, an Interbus port, a Controller Area Network (CAN) port, or a Firewire port.

Any of the case above, wherein the plurality of bosses prevent the display from being over-compressed by the frame plate.

Any of the case above, wherein first ends of the one or more drainage channels are closer to the display than second ends of the one or more drainage channels and the first ends are higher than the second ends.

Any of the case above, wherein the enclosure assembly further comprises one or more light emitting diode (LED) indicators and a diffuser configured to diffuse lights from the one or more indicators.

Any of the case above, wherein the display is a touch-sensitive display.

This written description uses examples to disclose aspects of the present disclosure, including the preferred embodiments, and also to enable any person skilled in the art to practice the aspects thereof, including making and using any devices or systems and performing any incorporated methods. The patentable scope of these aspects is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. An enclosure assembly of a pump, comprising: a case body having an opening therein; a case cover coupled to the case body proximal to the case body opening, the case cover having an outer surface and an underside surface, the underside surface facing the case body, wherein the case cover and the case body form a gap between the underside surface of the case cover and the case body in a portion of the case cover, the case cover having an opening extending through the case cover from the outer surface of the case cover to the underside surface; a display integrated with the case cover proximate to the opening in the case cover; a plurality of bosses locatable between the case body and the case cover; a frame plate removably fastened to the plurality of bosses, wherein the display is fixedly attached to the case cover between the frame plate and the underside surface of the case cover when the frame plate is fastened to the plurality of bosses; and one or more drainage channels formed in the underside surface of the case cover, the one or more drainage channels being configured to channel a flow of fluid received within the enclosure assembly, wherein at least one of the one or more drainage channels has a first end closer to the display and the opening than a second end and which extends along the underside surface away from the display to the second end to divert fluid near the display away from the display, wherein the first end is located on the underside surface of the case cover at a location that is higher than the second end when the case cover is on the case body during use.

2. The enclosure assembly of claim 1, wherein the plurality of bosses prevent the display from being over-compressed by the frame plate.

3. The enclosure assembly of claim 1, further comprising:
 a base including a pump cover configured to fluidically couple to the pump.

4. The enclosure assembly of claim 3, wherein the one or more drainage channels are further configured to divert the fluid toward the pump cover.

5. The enclosure assembly of claim 1, further comprising:
 one or more light emitting diode (LED) indicators; and
 a diffuser configured to diffuse lights from the one or more LED indicators.

6. The enclosure assembly of claim 1, wherein the display is a touch-sensitive display.

7. A protective case for a pump assembly, comprising: a base; and an enclosure assembly configured to mateably couple with the base, comprising: a case body having an opening therein; a case cover coupled to the case body proximal to the case body opening, the case cover having an outer surface and an underside surface, the underside surface facing the case body, wherein the case cover and the case body form a gap between the underside surface of the case cover and the case body in a portion of the case cover; the case cover having an opening extending through the case cover from the outer surface of the case cover to the underside surface; a display integrated with the case cover; a plurality of bosses locatable between the case body and the case cover; a frame plate removably fastened to the plurality of bosses, wherein the display is fixedly attached to the case cover between the frame plate and the underside surface of the case cover when the frame plate is fastened to the plurality of bosses; and one or more drainage channels formed in the underside surface of the case cover, the one or more drainage channels being configured to channel a flow of fluid received within the protective case, wherein at least one of the one or more drainage channels has a first end closer to the display and the opening than a second end and which extends along the underside surface away from the display to the second end to divert fluid on or near the display away from the display, wherein the first end is located on the underneath surface of the case cover at a location that is higher than the second end when the case cover is on the case body during use.

8. The protective case of claim 7, further comprising a pump head, wherein the base comprises a pump cover configured to fluidically couple to the pump head.

9. The protective case of claim 8, wherein the one or more drainage channels are further configured to channel the flow of the fluid toward the pump cover.

10. The protective case of claim 7, wherein the base comprises a motor configured to drive a pump head.

11. The protective case of claim 7, wherein the base comprises a lip configured to mateably couple to an edge of the enclosure assembly to prevent fluid from entering the case.

12. The protective case of claim 7, wherein the base comprises an interface panel including one or more electrical ports.

13. The protective case of claim 12, wherein the one or more electrical ports include at least a Universal Serial Bus port, an Ethernet port, a Profibus port, a serial port, a parallel port, a phone jack port, an Interbus port, a Controller Area Network (CAN) port, or a Firewire port.

14. The protective case of claim 7, wherein the plurality of bosses prevent the display from being over-compressed by the frame plate.

15. The protective case of claim 7, wherein the enclosure assembly further comprises:
 one or more light emitting diode (LED) indicators; and
 a diffuser configured to diffuse lights from the one or more LED indicators.

16. The protective case of claim 7, wherein the display is a touch-sensitive display.

* * * * *